(12) United States Patent
Champel

(10) Patent No.: US 7,716,559 B2
(45) Date of Patent: May 11, 2010

(54) METHOD FOR LOST PACKET RECONSTRUCTION AND DEVICE FOR CARRYING OUT SAID METHOD

(75) Inventor: Mary-Luc Champel, Marpire (FR)

(73) Assignee: Thomson Licensing, Boulogne-Billancourt (FR)

( * ) Notice: Subject to any disclaimer, the term of this patent is extended or adjusted under 35 U.S.C. 154(b) by 799 days.

(21) Appl. No.: 10/576,930

(22) PCT Filed: Sep. 27, 2004

(86) PCT No.: PCT/FR2004/050464

§ 371 (c)(1),
(2), (4) Date: Apr. 24, 2006

(87) PCT Pub. No.: WO2005/041466

PCT Pub. Date: May 6, 2005

(65) Prior Publication Data

US 2007/0124651 A1    May 31, 2007

(30) Foreign Application Priority Data

Oct. 23, 2003    (FR) .................................. 03 12391

(51) Int. Cl.
*G11C 29/00* (2006.01)
(52) U.S. Cl. ..................................... 714/776
(58) Field of Classification Search ................. 714/776, 714/777, 746, 752
See application file for complete search history.

(56) References Cited

U.S. PATENT DOCUMENTS

| | | | |
|---|---|---|---|
| 4,364,081 A | 12/1982 | Hashimoto et al. | |
| 4,417,339 A | 11/1983 | Cantarella | |
| 4,447,902 A | 5/1984 | Wilkinson | |
| 4,649,850 A | 3/1987 | Akiba | |

(Continued)

FOREIGN PATENT DOCUMENTS

CA    2310997    12/2000

(Continued)

OTHER PUBLICATIONS

Cai et al., FEC based video streaming over packet loss networks with pre-interleaving, 2001, IEEE, p. 10-14.*

(Continued)

*Primary Examiner*—Shelly A Chase
(74) *Attorney, Agent, or Firm*—Robert D. Shedd; Paul P. Kiel; Brian J. Borini

(57) ABSTRACT

The invention concerns a method for securing a data packet stream involving the following steps: arranging the packets to be sent in a matrix of D rows and L columns; to each row and each column of the matrix, applying an error correction function, the result of which is a correction packet; then sending the resulting correction packets in addition to the data packets. The invention also concerns a method for reconstructing lost packets in a data packet stream involving the following steps: arranging the received packets in a matrix of D rows and L columns, taking their sequence number into account; to each row and each column of the matrix containing at least one lost packet, applying a function for reconstructing missing packets using the received packets and the correction packet corresponding to the row or to the column. The invention also concerns the devices implementing these methods.

12 Claims, 4 Drawing Sheets

U.S. PATENT DOCUMENTS

| | | |
|---|---|---|
| 4,716,567 A | 12/1987 | Ito et al. |
| 4,760,576 A | 7/1988 | Sako |
| 4,796,261 A | 1/1989 | Moriwaki |
| 5,159,452 A | 10/1992 | Kinoshita |
| 5,392,299 A | 2/1995 | Rhines et al. |
| 5,412,667 A | 5/1995 | Havemose |
| 5,450,421 A | 9/1995 | Joo et al. |
| 5,559,506 A | 9/1996 | Leitch |
| 5,590,636 A | 1/1997 | Yamashita |
| 5,615,222 A | 3/1997 | Wright et al. |
| 5,642,365 A | 6/1997 | Murakami et al. |
| 5,677,918 A | 10/1997 | Tran et al. |
| 5,694,262 A | 12/1997 | Takata |
| 5,699,062 A | 12/1997 | Widmer |
| 5,757,825 A | 5/1998 | Kimura et al. |
| 5,844,918 A | 12/1998 | Kato |
| 5,944,843 A | 8/1999 | Sharma et al. |
| 6,122,763 A | 9/2000 | Pyndiah et al. |
| 6,519,294 B1 | 2/2003 | Shiraishi et al. |
| 6,577,813 B1 | 6/2003 | Ibaraki et al. |
| 6,785,733 B1 | 8/2004 | Mimura et al. |
| 6,904,095 B1 | 6/2005 | Wilkinson et al. |
| 7,020,823 B2 * | 3/2006 | Bushmitch et al. .......... 714/752 |
| 7,389,463 B2 | 6/2008 | Ramaswamy et al. |
| 2002/0053049 A1 | 5/2002 | Shiomoto et al. |

FOREIGN PATENT DOCUMENTS

| | | |
|---|---|---|
| CN | 1 274 088 | 9/2006 |
| EP | 0 306 196 | 8/1988 |
| EP | 0 928 116 | 7/1999 |
| EP | 0 663 776 | 7/2000 |
| EP | 1059757 | 12/2000 |
| JP | 10-135849 | 5/1998 |
| JP | 11-088856 | 3/1999 |
| JP | 11-150575 | 6/1999 |
| JP | 11-196072 | 7/1999 |
| JP | 2000-036761 | 2/2000 |
| JP | 2000-165438 | 6/2000 |
| JP | 2000-174819 | 6/2000 |
| JP | 2000-187940 | 7/2000 |
| JP | 2000-349792 | 12/2000 |
| JP | 7-312030 | 11/2005 |
| KR | 850003096 | 5/1985 |
| KR | 930017343 | 9/1993 |
| KR | 010013217 | 3/2001 |

OTHER PUBLICATIONS

Search Report Dated Jan. 20, 2005.
H. Schulzrinne et al., "RTP: A Transport Protocol for Real-Time Application", Network Working Group, Request for Comments: 1889, Category: Standards Track, Jan. 1996, pp. 1-75.
J. Rosenberg et al., "An RTP Payload Format for Generic Forward Error Correction", Network Working Group, Request for Comments: 2733, Category: Standards Track, The Internet Society, Dec. 1999, pp. 1-26.
Pro-MPEG Code of Practice #3, "Transmission of Professional MPEG-2 Transport Streams over IP Networks", Pro-MPEG Forum, Jan. 2003, pp. 1-11.
Pro-MPEG Code of Practice #3 release 2, "Transmission of Professional MPEG-2 Transport Streams over IP Networks", Pro-MPEG Forum, Jul. 2004, pp. 1-17.
Oguz, N. C. et al., "Performance Analysis of Two-Level Forward Error Correction for Lost Cell Recovery in ATM Networks", Proceedings of Infocom '95—Conference on Computer Communications. Fourteenth Annual Joint Conference of the IEEE Computer and Communications Societies, Boston, Apr. 2-6, 1995, Los Alamitos, IEEE Comp. Soc. Press, U.S., vol. 2, Conf. 14, Apr. 2, 1995, pp. 728-737, XP000580642.
Youzhi Xu, "Maximum Likelihood Erasure Decoding Scheme For Concatenated Codes", IEE Proceedings-1, vol. 139, No. 3, Jun. 1992, pp. 336-339.
Vic Hayes et al., "Part 11: Wireless LAN Medium Access Control (MAC) and Physical Lay (PHY) Specifications High-Speed Physical Layer In The 5 GHz Band", IEEE Standard for Information technology, Telecommunications and information exchange between systems, Local and metropolitan area networks, Specific requirements, ISO/IEC 8802-Nov. 1999/Amd Jan. 2000.

* cited by examiner

METHOD FOR LOST PACKET RECONSTRUCTION AND DEVICE FOR CARRYING OUT SAID METHOD

CROSS-REFERENCE TO RELATED APPLICATIONS

This application claims the benefit, under 35 U.S.C. §365 of International Application PCT/FR04/050464, filed Sep. 27, 2004, which was published in accordance with PCT Article 21(2) on May 6, 2005 in French and which claims the benefit of French patent application No. 0312391, filed Oct. 23, 2003.

TECHNICAL FIELD

The present invention concerns error correction when sending digital data in the form of packets.

BACKGROUND

When sending digital data over a network in the form of data packets, the packets may be affected by transmission errors. Networks enabling the transfer of digital data in the form of packets have particular characteristics, such as bandwidth, latency or reliability, that vary from one type of network to another. Depending on the type of network, different levels of sensitivity can be observed for different types of errors likely to occur during data transmission by packet over this network. The types of errors likely to arise include the transmission of a packet with an erroneous bit, the random loss of a packet, the loss of a sequence of adjacent packets, the duplication of a packet or of a sequence of packets.

SUMMARY

Traditionally, there are two types of method for addressing these errors. First, there are the error detection methods for detecting that a transmitted packet is in error and for ignoring it. Generally these methods are used when the transmission protocol has the facility to request that the lost packet be resent. Examples of such methods include the CRC (Cyclic Redundancy Check) method and the TCP (Transmission Control Protocol) protocol on IP networks. Secondly, there are methods enabling not only the detection of an erroneous packet, but also its reconstruction. These methods are known under the acronym FEC (Forward Error Correction) and are well suited to protocols in which it is not possible to request that an erroneous data packet be resent. An example of the use of such methods occurs in the case of protocols for transmitting multimedia content in real time, where meeting the real-time requirement is incompatible with resending erroneous packets. The RTP (Real Time Protocol) protocol is an example of such a case.

The general principle of operation of FEC methods is applying a function, for example an XOR, to a group of data packets. The result of this function produces a packet, called a correction packet, which is transmitted in addition to the data packets used to generate it. When a packet is detected as being in error, the correction packet, associated with the correctly transmitted packets, enables the erroneous packet to be reconstructed. However, this method has its limitations in that there are some errors that cannot be corrected. Specifically, if there are two erroneous packets in the group of packets used to generate a correction packet via the XOR function, that correction packet may not be sufficient to reconstruct the two erroneous packets. The strategy adopted in choosing packets for generating the correction packet is therefore crucial to the effectiveness of the correction method. In particular, this strategy will depend on the type of errors occurring most frequently on the type of network used. For example, computing the correction function on N adjoining packets will result in correcting random errors that are few in number, but will be ineffective on a series of lost packets. To address series of lost packets, a known approach, as documented for example in the Pro-MPEG forum's "Code of Practice", is to compute the correction function on a group of D packets taken periodically every L packets. The function is applied to packets i, i+L, i+2L, . . . , i+(D−1)L. In this way, a series of erroneous packets, of at most L adjoining packets, may be corrected by the method.

The problem with this method is that, although very well suited to series of erroneous packets, it turns out to have a statistical rate of success that decreases very rapidly as the rate of random errors increases. The need is therefore apparent of a method that better withstands an increase in the rate of random errors while maintaining good correction performance for series of data packets.

The aim of the invention is therefore to propose such a method. It consists in applying the correction function to D packets as described above but also in applying it to L packets numbered i, i+1, i+2, . . . , i+L−1. In this way, each data packet is used to compute two correction packets, and the correction rate in the presence of random errors increases significantly while maintaining good correction performance for series of data packets.

The invention concerns a method for securing a data packet stream involving the following steps: arranging the packets to be sent in a matrix of D rows and L columns; to each row and each column of the matrix, applying an error correction function, the result of which is a correction packet; then sending the resulting correction packets in addition to the data packets.

According to another aspect of the invention, the correction function is also applied to the row formed by correction packets resulting from the application of the correction function to each column of the matrix generating an additional correction packet.

According to another aspect of the invention, the correction function is also applied to the column formed by correction packets resulting from the application of the correction function to each row of the matrix generating an additional correction packet.

According to another aspect of the invention, the headers of the correction packets contain a field for distinguishing whether they have been computed on a row or a column of the matrix.

According to another aspect of the invention, the correction packets are transmitted in the same stream as the data packets.

According to another aspect of the invention, the correction packets are transmitted in a different stream from the one conveying the data packets.

The invention also concerns a method for reconstructing lost packets in a data packet stream involving the following steps: arranging the received packets in a matrix of D rows and L columns, taking their sequence number into account; to each row and each column of the matrix containing at least one lost packet, applying a function for reconstructing missing packets using the received packets and the correction packet corresponding to the row or to the column.

According to another aspect of the invention, the reconstruction function can also be applied to a row or a column of correction packets using an additional correction packet generated for this purpose.

The invention also concerns a transmitter device for transmitting a data packet stream over a network containing computation means generating a correction packet by applying a correction function to a group of data packets and characterized in that the device contains means for applying this function to the rows and to the columns of a matrix formed by data packets.

According to another aspect of the invention, the means applying the function do so according to the method disclosed in the patent.

The invention also concerns a receiver device for receiving a data packet stream over a network containing means for computing lost packets as a function of the data packets and correction packets received, characterized in that the device has means for applying these computation means to the rows and to the columns of a matrix of data packets of the stream and to the correction packets corresponding to these rows and these columns.

According to another aspect of the invention, the correction packets are generated according to one of the methods disclosed in the patent.

DESCRIPTION OF THE DRAWINGS

The invention will be better understood, and other features and advantages will become apparent, on reading the following description which makes reference to the accompanying drawings in which.

DETAILED DESCRIPTION

Figure 5:
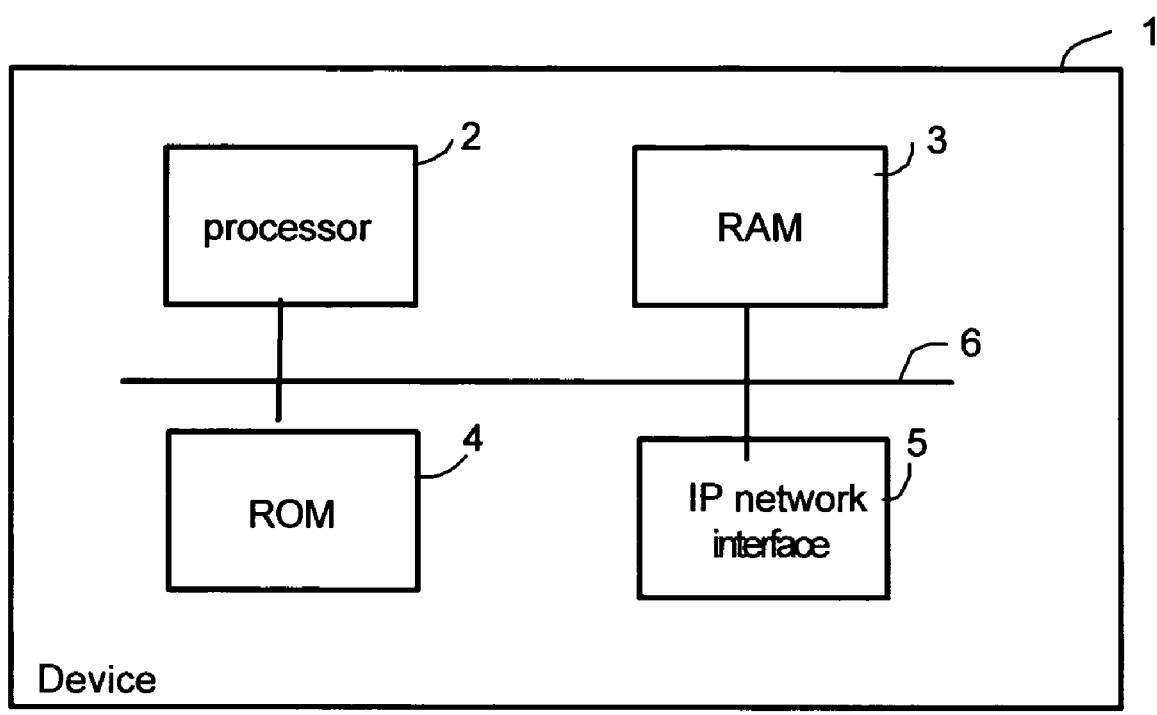
FIG. 5 represents the hardware architecture of a transmitter or receiver device according to the example implementation of the invention.
Figure 6:
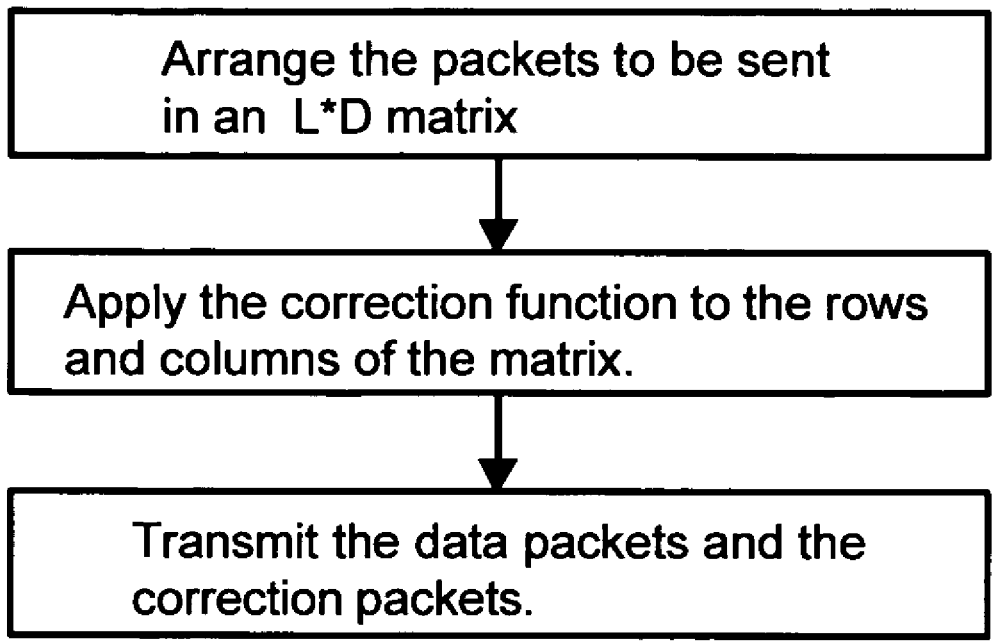
FIG. 6 represents the steps of the method for the transmitter.
Figure 7:
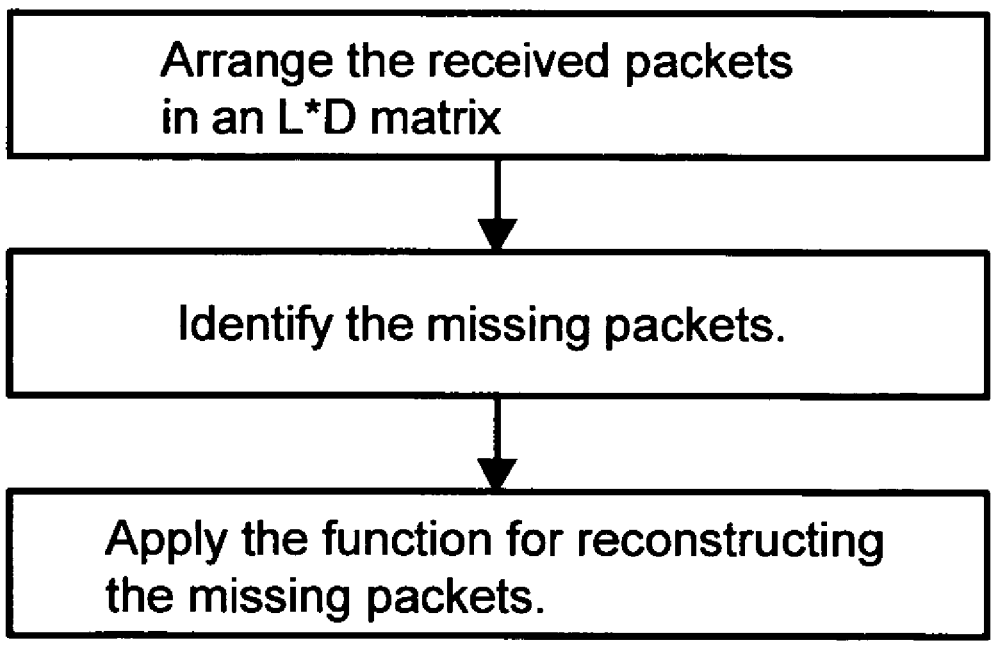
FIG. 7 represents the steps of the method for the receiver.

FIG. 5 represents the internal architecture of a transmitter or receiver device 1 which contains ROM (Read-Only Memory) 4 enabling it to store programs and data, and RAM (Random Access Memory) 3 enabling it to load these programs in preparation for an execution by the processor 2. This device is connected to an IP network via a network interface 5 which means that it can transmit or receive the streams. These components communicate via an internal bus 6.

The example implementation of the invention is in the context of digital data transfer in real time over an IP network. The data is transmitted, in this example implementation, in the form of a stream via the RTP (Real Time Protocol) protocol. As already mentioned, RFC 2733 describes a standard way to correct data packets transmitted by the RTP protocol. This method was the subject of an extension described in the Pro-MPEG forum's "Code of Practice" document. The example implementation of the invention which will now be described is an improvement that is compatible with this method.

Figure 1:
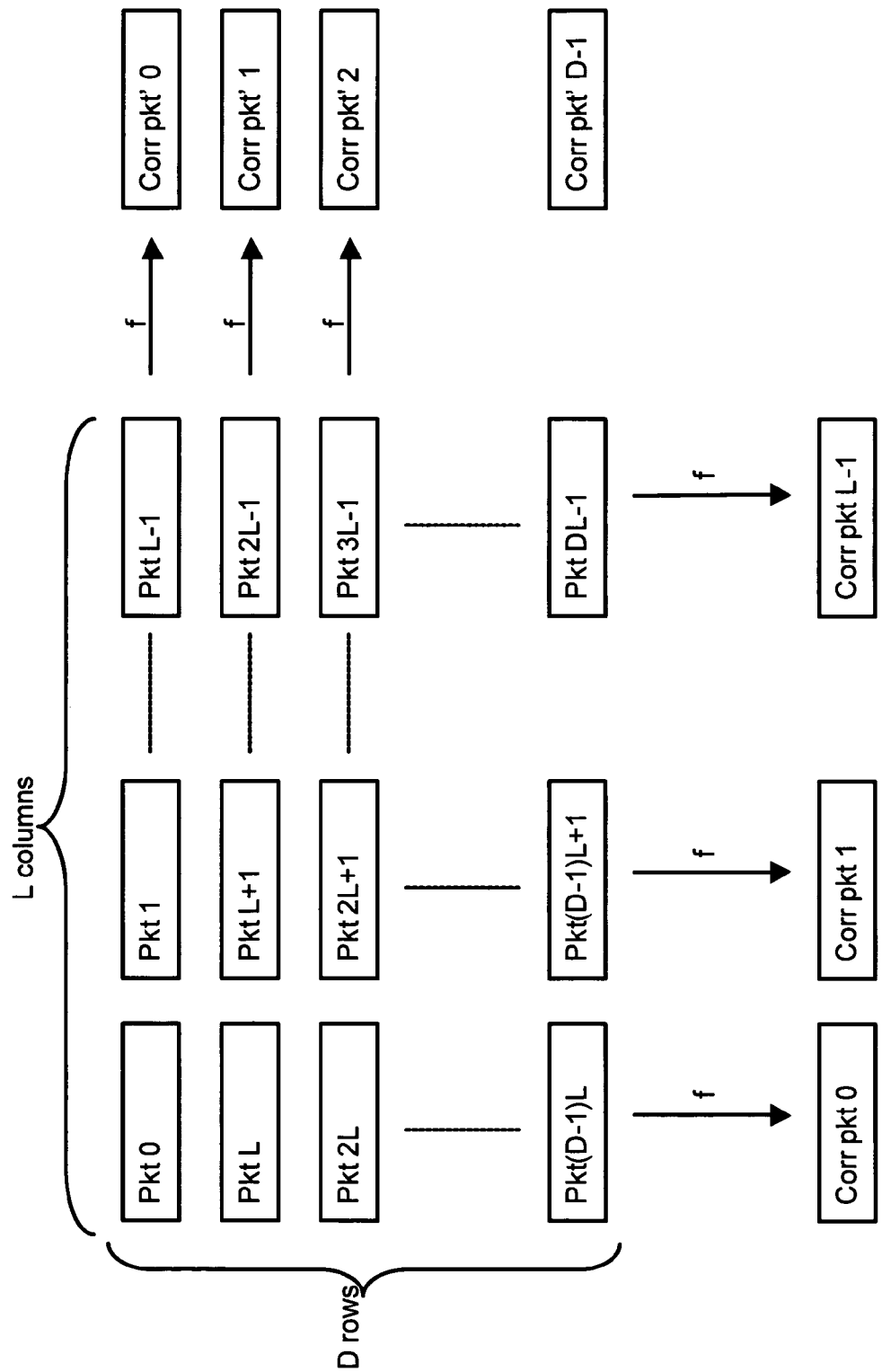
FIG. 1 is a block-diagram representation of the application of the correction function to data packets.

In this example implementation, the data packets are separated into groups of L*D packets. They are then arranged in a matrix of D rows and L columns, as FIG. 1 shows. L and D are chosen according to the effectiveness desired. The way in which these parameters affect the effectiveness of the correction method will be described later. A correction function is then applied to each column of the matrix; the same correction function is also applied to each row of the matrix. This correction function can be an XOR, which would be the simplest to implement, but other functions are also possible such as the Reed-Solomon function or a Hamming code. These functions are more powerful but more costly in terms of computation. Whichever correction function is chosen, the result of applying this function to a group of packets, in this case a row or a column of the matrix, is a packet referred to as the correction packet. The method therefore results in L correction packets corresponding to the application of the function to each column and D correction packets corresponding to the application of the function to each row. It is also possible to add a correction packet computed by applying the correction function to the correction packets themselves, thus adding a second level of protection for correcting a loss of a correction packet.

These packets must be transmitted to the data stream. This transmission can be performed in several ways. The correction packets can be transmitted in the same stream as the data packets, but they are then subject to the same transmission risks as the stream they are protecting. They can also be transmitted in a separate stream, thus increasing the resistance to errors.

The method described by the Pro-MPEG forum consists in computing and sending the correction packets computed from the columns of the matrix. The method disclosed in the patent, insofar as it sends these same packets, remains compatible with the Pro-MPEG method. This is because receiver devices according to this standard will ignore the correction packets computed on the rows of the matrix and will therefore be able to operate in the same way with a transmitter according to the invention and with a transmitter according to the Pro-MPEG method.

Figure 2:
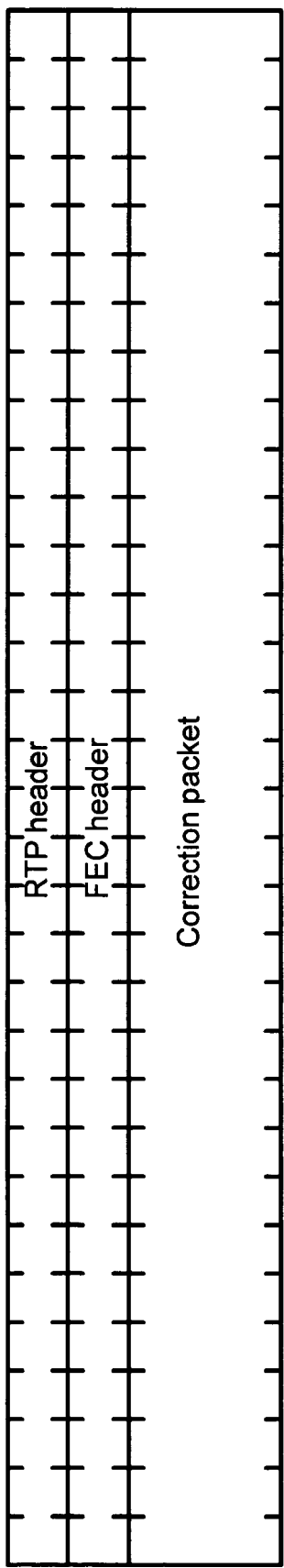
FIG. 2 represents the structure of a correction packet placed in a packet according to the RTP protocol.
Figure 3:
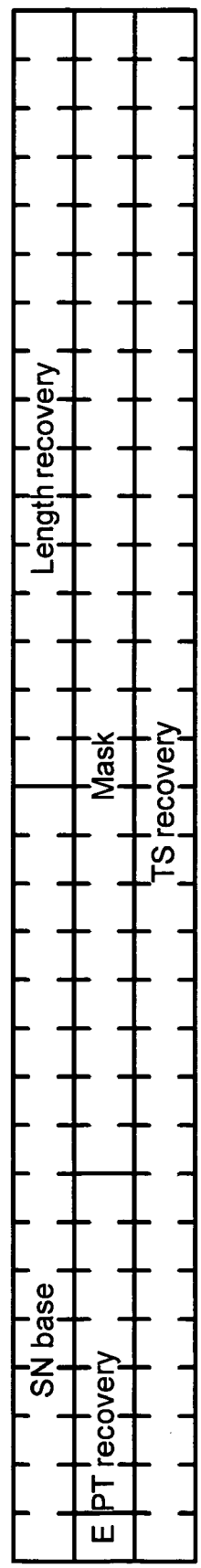
FIG. 3 represents the header of a correction packet according to RFC 2733.

The structure of a packet, as described in the RFC, is represented in FIG. 2. It consists of an RTP packet header, a description of which can be found in RFC 1889. This header is followed by an FEC header and then the actual correction packet. The structure of an FEC header according to RFC 2733 is represented in FIG. 3. This header contains an SN base field which contains the lowest sequence number of the group of data packets used to construct the correction packet. The Length recovery field is used to determine the length of any data packet. It is constructed by applying the correction function to the group formed by the lengths of each data packet. The E field is used to indicate an extension to the header. The PT recovery field is obtained by applying the correction function to the data packet Type field. The Mask field is a 24-bit field for determining which data packets are used to construct the correction packet. If bit i is at 1, this means that packets N+i are used to construct the correction packet. N is the base stored in the SN base field. The TS recovery field is computed by applying the correction function to the timestamps of the data packets. It is used to reconstruct these timestamps.

Figure 4:
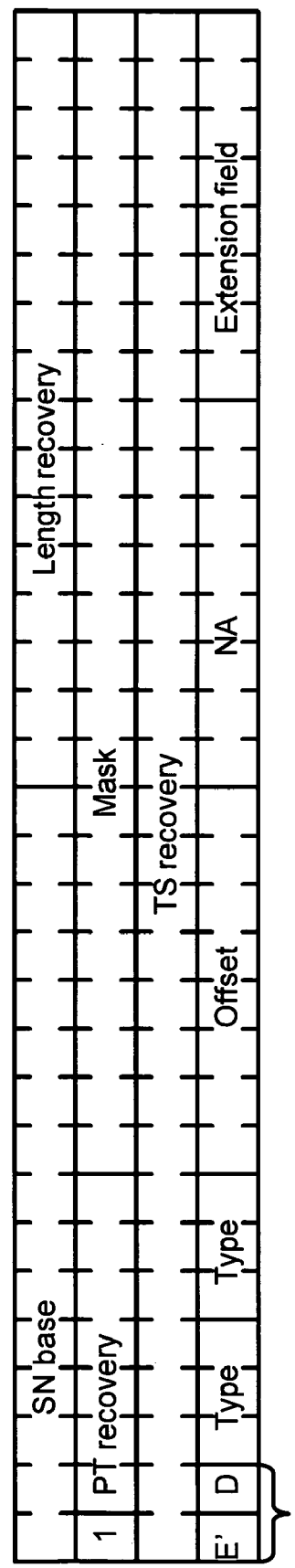
FIG. 4 represents the header of a correction packet according to the example implementation of the invention described.

It is observed that through this mechanism, correction packets can only be computed on groups of a maximum of 24 data packets. To exceed this limit, an extension to this header is defined in the Pro-MPEG forum's "Code of Practice" document. This extension is represented in FIG. 4, which shows the same header as previously, with the extension field set to 1. A new 2-bit extension field, E, is added which determines the use of the "Extension field" field. The Type field indicates which correction function is used: 0 for XOR, 1 for a Hamming code, 2 for a Reed-Solomon function. The Index field is used to order the FEC packets in the event that the result of the correction function exceeds the maximum size of a packet. This can be the case for complex correction functions. The Offset field determines the period chosen to select the data packets; it corresponds to the parameter L of the matrix. The NA (Number of Associated) field determines the number of associated data packets for the generation of the correction packet; this number corresponds to the parameter D of the matrix. The "Extension field" field is reserved for future use. The Mask field has become useless and is initialized by filling bytes having a value of 0.

The modification brought about by the invention consists in separating the 2-bit E field into a new 1-bit E' field and a 1-bit D field which determines whether the correction packet in question is computed on the columns, in which case this D field is set to 0. If the correction packet is computed on a row, this D field is set to 1. It is observed that through this mechanism, a correction packet computed on a column remains completely identical to the same packet computed according to the Pro-MPEG forum method, while the additional packets computed on the rows can be identified by the presence of the D field set to 1, which amounts to setting to 1 the 2-bit extension field, E, if the packet is interpreted according to the Pro-MPEG method indicating that this packet is using an extension in the format defined by the forum.

When packets are being received, the receiver will store the received packets in a buffer. The size of this buffer must be such that it can store at least L*D data packets and the L+D corresponding correction packets. The distinction between the data packets and the correction packets is made by the Type field of the RTP header as described in RFC 1889 that describes this protocol. It will be possible to identify the data packets among them through their sequence number and the correction packets among them through the SN base field of their header. Knowledge of the missing packets will then enable an attempt to be made to reconstruct them by using the correction function and the correction packets. For example, if the correction function used is the XOR function, it is possible to correct the loss of one data packet in a group of data packets used to generate a correction packet, using this correction packet. There will therefore be identified in the matrix of received packets, the rows and columns containing only one lost packet in order to reconstruct them with the corresponding correction packet. The correction can, for example, be carried out using the following method:

Computation of a vector NLi of the number of missing data packets in row i.
Computation of a vector NCi of the number of missing data packets in column i.
While there remains a missing packet in the matrix:
  Find the minimum index p such that $NL_p=1$;
    If such a p exists:
      Find the column index q corresponding to the missing packet
      Reconstruct the missing packet of index p and q by applying the XOR function to the other packets of the row and to the correction packet corresponding to this row
      $NL_p=0$; $NC_q=NC_q-1$;
    In the absence of such an index p find a minimum index q such that $NC_q=1$
      If such a q exists:
        Find the column index p corresponding to the missing packet
        Reconstruct the missing packet of index p and q by applying the XOR function to the other packets of the row and to the correction packet corresponding to this column
        $NL_p=NL_p-1$; $NC_q=0$;
      Else, the reconstruction method has failed.

In the event of success, all the lost packets are reconstructed.

Parameters L and D of the method must be chosen with consideration to the following information. First, the overhead generated by the correction packets which must be sent in addition to the data packets is $1/L+1/D$; therefore choosing large values for L and D will minimize occupation of the bandwidth required for the use of the method. Furthermore, the method can be used to correct series of lost packets of at most L+1 adjoining packets, so the larger L will be, the more effective the method will be in correcting this type of error. The method is capable of correcting all random packet losses up to three lost packets and certain random packet losses up to D+L−1 lost packets. The symmetry of the problem leads to a maximum effectiveness on the random packet losses when L and D have the same value. Now, the method requires buffers in both the receiver and transmitter devices, having a minimum size of L*D packets. It is therefore observed that choosing large values for L and D is beneficial to maximize the effectiveness of the method but the choice is restricted by the size of the transmit and receive buffers of the devices. Another limitation can arise from the correction function computation time which can become long for a large number of packets and if a complex function is chosen.

Statistical calculations can be used to compare the effectiveness of the method with that described by the Pro-MPEG forum. As expected, its effectiveness is observed to be markedly increased. For example, by using the XOR correction function and a matrix in which L and D have a value of 6, the method corrects 94.1 percent of random losses of 6 data packets while the RFC method corrects only 2.4 percent. The method therefore turns out to be much more effective in correcting random losses of data packets in the stream. The method is capable of correcting all losses of adjacent packets up to D+1 successive packets where the Pro-MPEG method corrects only up to D successive packets. It is therefore observed that the performance on the loss of adjacent data packets is slightly improved while the performance on random errors is greatly increased.

It is clear, for the person skilled in the art, that the example implementation described here is not limiting. In particular, the invention can be used in the context of all protocols for transferring data by packets and not only in the context of RTP. It is also possible to use any correction function; the invention is not limited to the correction functions mentioned in the patent.

The invention claimed is:

1. A method for securing a data packet stream, comprising the following steps:
   arranging the packets to be sent in a packet matrix of D rows and L columns;
   to each row and each column of the matrix, applying an error correction function, the result of which is a correction packet enabling the reconstruction of at least one lost packet in the row, respectively the column, to which the error correction function is applied; and
   sending the resulting correction packets in addition to the data packets.

2. The method according to claim 1, wherein the correction function is also applied to the row formed by correction packets resulting from the application of the correction function to each column of the matrix generating an additional correction packet.

3. The method according to claim 1, wherein the correction function is also applied to the column formed by correction packets resulting from the application of the correction function to each row of the matrix generating an additional correction packet.

4. The method according to claim 1, wherein the headers of the correction packets contain a field for distinguishing whether they have been computed on a row or a column of the matrix.

5. The method according to claim 1, wherein the correction packets are transmitted in the same stream as the data packets.

6. The method according to claim 1, wherein the correction packets are transmitted in a different stream from the one conveying the data packets.

7. A method for reconstructing lost packets in a data packet stream, comprising the following steps:
   arranging the received packets in a matrix of D rows and L columns, taking their sequence number into account; and
   to each row and each column of the matrix containing at least one lost packet, applying a function for reconstructing missing packets using the received packets and the correction packet corresponding to the row or to the column.

8. The method according to claim 7, wherein the reconstruction function can also be applied to a row or a column of correction packets using an additional correction packet generated for this purpose.

9. A transmitter device for transmitting a data packet stream over a network containing computation means generating a correction packet by applying a correction function to a group of data packets, wherein the device includes means for applying this function to rows and to columns of a matrix formed by data packets.

10. The transmitter device according to claim 9 wherein the means for applying the function comprises means for securing a data packet stream including the following:
    means for arranging the packets to be sent in a packet matrix of D rows and L columns;
    means for applying an error correction function to each row and each column of the matrix, the result of which is a correction packet enabling the reconstruction of at least one lost packet in the row, respectively the column, to which the error correction function is applied; and
    means for sending the resulting correction packets in addition to the data packets.

11. A receiver device for receiving a data packet stream over a network containing means for computing lost packets as a function of the data packets and correction packets received, wherein the device has means for applying these computation means to rows and to columns of a matrix of data packets of the stream and to the correction packets corresponding to these rows and these columns.

12. The device according to claim 11 comprising means for reconstructing lost packets in a data packet stream, that include the following means:
    means for arranging the received packets in a matrix of D rows and L columns, taking their sequence number into account; and
    means for applying a function for reconstructing missing packets to each row and each column of the matrix containing at least one lost packet, the means using the received packets and the correction packet corresponding to the row or to the column.

* * * * *